United States Patent [19]

Brokaw

[11] Patent Number: 4,709,167
[45] Date of Patent: Nov. 24, 1987

[54] THREE-STATE OUTPUT BUFFER WITH ANTI-SATURATION CONTROL

[75] Inventor: Adrian P. Brokaw, Burlington, Mass.

[73] Assignee: Analog Devices, Inc., Norwood, Mass.

[21] Appl. No.: 408,480

[22] Filed: Aug. 16, 1982

[51] Int. Cl.[4] .................. H03K 19/013; H03K 19/088
[52] U.S. Cl. ..................................... 307/443; 307/456; 307/473; 307/475; 307/300; 307/299.2
[58] Field of Search ............... 307/443, 473, 456–458, 307/280, 300, 299 A, 299 B, 475; 364/716

[56] References Cited

U.S. PATENT DOCUMENTS

| | | | |
|---|---|---|---|
| 3,751,680 | 8/1973 | Hodges | 307/458 |
| 4,049,975 | 9/1977 | Colaco | 307/299 A X |
| 4,081,695 | 3/1978 | Allen et al. | 307/473 |
| 4,322,640 | 3/1982 | Fukushima et al. | 307/456 X |
| 4,339,675 | 7/1982 | Ramsey | 307/456 X |
| 4,376,900 | 3/1983 | Metzger | 307/473 |

Primary Examiner—Stanley D. Miller
Assistant Examiner—D. R. Hudspeth
Attorney, Agent, or Firm—Parmelee, Bollinger & Bramblett

[57] ABSTRACT

A three-state output buffer delivering digital signals to a multi-line bus when in the data state, and presenting a high-impedance to the bus in the third state. The buffer output includes a two-transistor totem pole. Individual control transistor drivers are provided to switch the output transistors off when switching to the third state. The control transistors are actively driven both on and off. One of the output transistors includes an inverted-mode auxiliary collector which reduces base drive and saturation in that transistor, and which serves to hold off the other output transistor. Common control circuitry for all the buffer stages includes special means for reducing saturation effects to speed up control signals.

26 Claims, 1 Drawing Figure

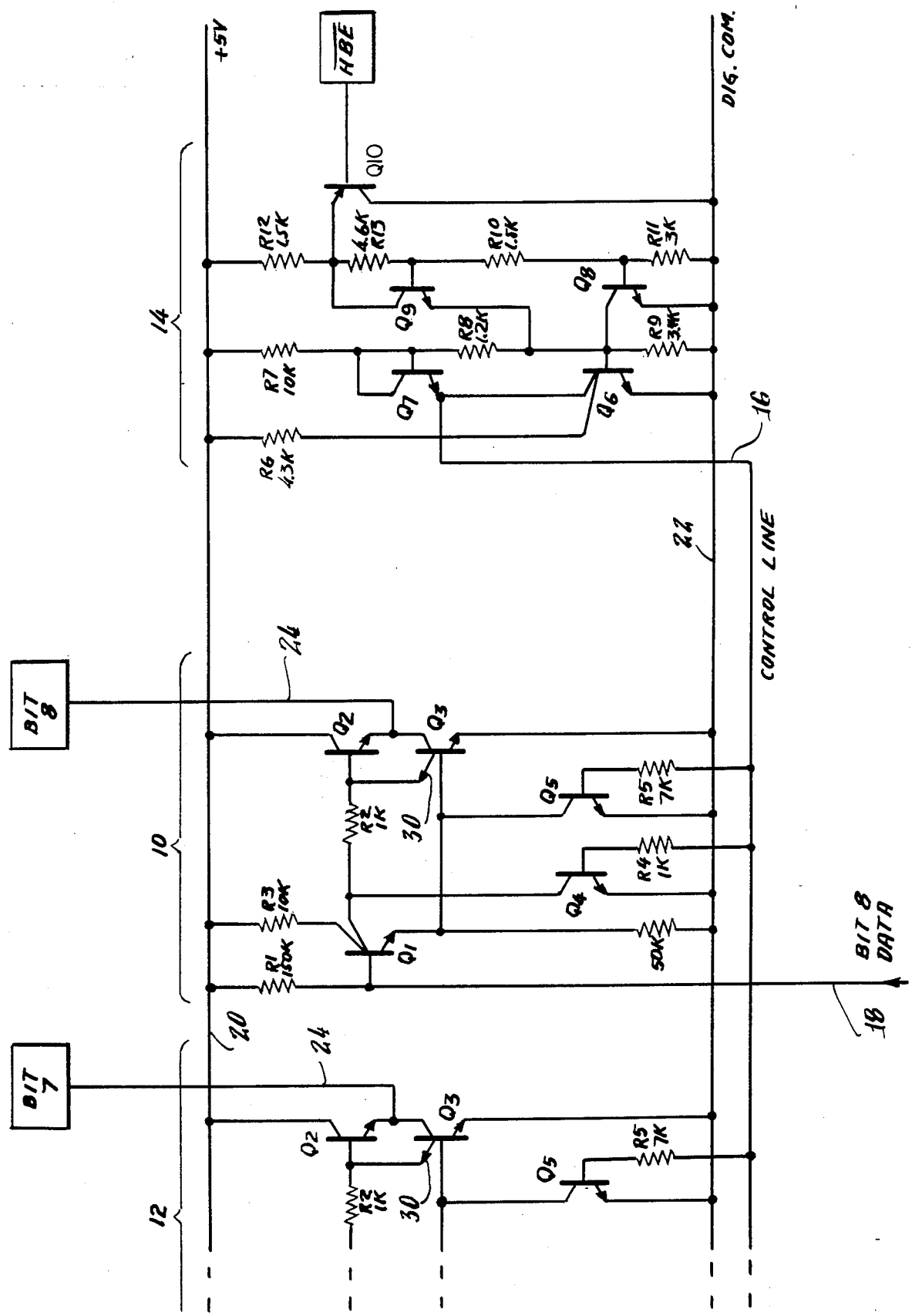

4,709,167

1

THREE-STATE OUTPUT BUFFER WITH ANTI-SATURATION CONTROL

BACKGROUND OF THE INVENTION

1. Field of the Invention

This invention relates to output buffers for digital electronic components such as analog-to-digital converters. More particularly, this invention relates to three-state output buffers for communicating with a multi-line bus.

2. Description of the Prior Art

There are many electronic components which must transfer a multi-bit output signal to a multi-line bus through which digital signals from other equipment must flow on a time-shared basis. To accommodate such other traffic, it has been the practice to employ a so-called three-state output buffer with the data-transferring component. Such a buffer in its "third state" presents a high output impedance to the bus, so that the traffic on the bus from other equipment will not be affected. When it is necessary for the component to deliver a digital signal to the bus, the buffer is switched from its third state to the data state, wherein output data is delivered from the component to the bus in the form of "ones" or "zeros". After delivery of the data, the output buffer is switched back to its high-impedance state.

For efficient data communications, it is important that switching between states be carried out at high speed. Conventionally, this has been achieved by the use of transistors which have been optimized for fast switching, such as those made for TTL logic. However, some components are made by IC processes which produce transistors incapable of such fast-switching operation. For example, processes have been developed to produce both linear transistors and inverted-mode transistors (so-called I$^2$L transistors) on the same chip, and in such compatible processes the transistors inherently have relatively long storage times which slows down their operation. Thus, there has developed a need for a three-state output buffer which uses the relatively slow transistors produced by such processes, and yet achieves fast operation in transferring data to the transmission bus.

SUMMARY OF THE INVENTION

In a preferred embodiment of the invention, to be described hereinbelow in detail, there is provided a three-state output buffer using conventional linear transistors and having special features for assuring fast switching between the third state and the data state. In accordance with one aspect of the preferred embodiment, special control transistors are provided which actively force both the buffer output transistors to their off state, producing a high output impedance. In another aspect of the preferred embodiment, the control transistors are actively driven both on and off to enhance their speed of operation. In accordance with still another aspect, an auxiliary inverted-mode collector is incorporated into one of the output transistors to reduce the stored charge in that transistor and to assure that the other output transistor is held positively in its off state.

A three-state output buffer in accordance with the invention provides fast switching between the third or high-impedance state and the data output state, in either direction. Switching between high and low data states need not be carried out at such high speed, since such data switching occurs when the buffer is in the third state, isolated from the bus.

Other objects, aspects and advantages of the invention will in part be pointed out in, and in part apparent from, the following description of a preferred embodiment, considered together with the accompanying drawing.

BRIEF DESCRIPTION OF THE DRAWING

The single FIGURE of the drawing presents a circuit diagram showing one stage of a multi-stage three-state output buffer, together with common control circuitry for all of the buffer stages.

DETAILED DESCRIPTION OF A PREFERRED EMBODIMENT

Referring now to the drawing, the circuit shown is part of a three-state output buffer used with an analog-to-digital converter such as that described in copending application Ser. No. 931,960, filed on Aug. 8, 1978 by M. A. Maidique and A. P. Brokaw now U.S. Pat. No. 4,400,689. That type of converter comprises both normal-mode linear transistors and inverted mode transistors (so-called I$^2$L transistors) which are formed together on a single IC chip by a compatible Linear - I$^2$L process. The linear transistors made by such a process are not optimized for switching speed, and tend to have relatively long storage times which slows down their operation, relative for example to the transistors usually fabricated for TTL logic circuits.

An analog-to-digital converter has a pre-selected number of output bits (e.g. 8 bits or 12 bits), and the output buffer for such a converter will have a buffer stage for each output bit. The circuitry shown in the drawing includes one such buffer stage 10 and a portion of a second identical buffer stage 12 for another bit. Both stages are switchable to the "third" or high-impedance output state by common control circuitry generally indicated at 14 and operable to produce a third-state command signal on a common control line 16.

The output buffer stage 10 receives its output data bit from a data line 18 connected to the analog-to-digital converter (not shown). This line is connected in the buffer to the base of a drive transistor Q1 which, like all of the transistors in the output buffer, is a normal-mode linear transistor. The base of Q1 also is connected through a resistor R1 to a positive supply line 20. The data line 18 may, for example, be connected in the a-to-d converter to an I$^2$L collector which can, when turned on, sink all of the current provided by R1, and thereby drive the base of Q1 negative.

The buffer stage 10 includes two output transistors Q2, Q3 which are connected in series between the positive supply line 20 and a common supply line 22, in a so-called totem pole configuration. The base of Q3 receives a data signal directly from the emitter of Q1, and the base of Q2 receives a data signal through a resistor R2 connected to a collector terminal of Q1. Another collector terminal of Q1 is connected through a resistor R3 to the positive supply line 20.

The data signals to Q2, Q3 are complementary. That is, one is a direct data signal and the other is an inverted data signal. Thus, when the buffer 10 is developing output data, one of the transistors Q2, Q3 is on, and the other is off, depending upon whether the converter data bit on line 18 is high or low. A buffer output line 24 is connected to the common junction between the two transistors Q2, Q3 to produce a corresponding output data bit. With the arrangement shown in this embodiment, the output data bit will be inverted, relative to the converter data bit on data line 18.

When it becomes necessary to switch the buffer 10 to a high-impedance output state, the control line 16 goes high, in a manner to be explained subsequently. This high command signal is directed through two resistors R4, R5 to the bases of respective control transistors Q4, Q5. The collector of Q4 is connected to the collector of Q1, and the collector of Q5 is connected to the emitter of Q1. When Q4 is driven on, it steals the drive from Q2 to pull down the base of that transistor. Simultaneously, Q5 turns on to pull down the base of Q3. Thus, both Q2 and Q3 are actively turned off by the outputs of Q4 and Q5 which override the data signals to Q2, Q3. A rapid transition occurs at the output line 24 from either data state (one or zero) to the high-impedance state.

When the buffer 10 is in the high-impedance state, the base of Q1 can be driven high or low without affecting the buffer output line 24. When the control line 16 is driven low, both Q4 and Q5 are switched off, releasing the bases of Q2 and Q3, and returning the buffer to data output condition.

If the base of Q1 is negative when the control line 16 goes low, no drive will be applied to the base of Q3, and the junction of R2 and R3 will no longer be held down. Since R3 connects to the positive supply line 20, the voltage at the junction of R2 and R3 will rise, and the base of Q2 will be driven positive. As a result, the output line 24 will be driven positive to indicate a "one" output.

Alternatively, if the base of Q1 is being driven positive when the common control line 16 goes low, the base drive will cause Q1 to stay on. Current from R3 released by Q4 will pass through Q1 to the base of Q3 which will have been released by Q5. As a result, Q3 will switch "on" and the output line 24 will indicate "zero" output.

As will be evident from the above description, when switching to the high-impedance state, the transistors which must go off are actively driven off. It also may be noted that the charge storage time of Q1 (which lacks off drive other than the internal logic level) is not a factor since it need not switch off to complete any of the critically-timed switching operations.

Another important feature of the buffer 10 is the inclusion of a saturation sensing collector for the lower output transistor Q3. Such saturation sensing collector is indicated in the drawing by the extra emitter 30 which is directed upwards. This collector is in effect an inverted-mode transistor integrated with Q3, and is provided to avoid a problem which otherwise can occur in the "zero" output state, i.e. where Q3 is driven on and Q2 is intended to be off.

The problem results from the fact that in such a condition the collector voltage of Q1 (which drives the base of Q2) will be more positive than the base of Q3, due to the saturation voltage of Q1. If R2 were not present, the base-emitter junction of Q2 could be forward-biased if the collector voltage of Q3 is sufficiently low as a result of being lightly loaded. Consequently, undesirable current would under those circumstances flow from the positive supply line 20 through both series-connected transistors Q2, Q3 to the common line 22.

To avoid that problem, the lower output transistor Q3 is formed with an additional N+ region 30 made with the normal emitter diffusion. This region acts as an inverted-mode collector for some of the electrons injected into the base as the normal-mode collector voltage of Q3 begins to drop below the base voltage. This inverted-mode collector 30 is switched on by the approach of voltage saturation of Q3, and produces a flow of current through R2 so as to develop across R2 a corresponding voltage drop. This voltage drop reduces the base voltage of Q2 and prevents it from being forward-biased sufficiently to permit any substantial current flow through both output transistors Q2 and Q3.

The provision of the inverted-mode collector 30 is superior to one conventional arrangement wherein a Darlington-connected transistor is used as the upper part of the totem pole. The Darlington circuit has the disadvantage that it is difficult to turn off the actual output transistor when driving the base of the Darlington, due to the high $\beta$ and large parasitic base capacitances of the linear device. It also is superior to other circuits which use a diode in series with a single output device.

The superiority of the preferred embodiment is particularly evident when switching from third state to data "one" state. When Q5 releases the bottom of R3, its voltage need rise only about one base-emitter voltage ($V_{BE}$) to forward-bias Q2 and transmit the rising voltage to the output. In conventional circuits, the drive to the upper totem pole transistor must rise nearly twice as much before the output responds. This difference is especially important when using linear transistors whose large parasitic capacitances severely limit the slew rate of internal nodes and hence of the output.

Still another function is performed by R2 in combination with the inverted-mode collector 30. When the circuit goes into the data "zero" state, substantial overdrive is provided to Q3 to insure fast switching. This overdrive results in excess base charge which under ordinary circumstances would slow down the turn-off of Q3 when the circuit is returned to the third state. However, as Q3 begins to saturate and turn on the inverted-mode collector 30, its base drive is reduced by the amount of this collector current. By properly choosing the value of R2, it can be insured that Q2 is safely held off without allowing the inverted-mode collector 30 to saturate. As a result, it steals away any base drive current from R3 which is in excess of what is required to keep Q3 barely saturated. Consequently, excess base charge is reduced and the switching time from data "zero" to the third state is reduced.

The control line 16 which controls the state of a number of buffer stages (of which stage 10 is one) is activated by the collector of Q6 forming part of the common control circuitry 14. This circuitry receives an input signal labelled $\overline{HBE}$ serving to initiate switchover to the third-state.

When the control circuitry output transistor Q6 is turned off, R6 connected to the positive supply line 20 will pull the Q6 collector and the control line positive. This will cause the pairs of control transistors in each buffer stage, typified by Q4 and Q5, to switch on, and all the buffer stages will be switched to the high-impedance third state.

If Q6 is switched on, it will sink the current from R6 and drive the common control line 16 low. This will pull down the bases of Q4, Q5, and the corresponding transistor pairs in the other buffer stages. This off drive will rapidly remove the stored base charges causing the control transistors to turn off and release the buffer to transmit data to the output.

It is desirable to switch Q6 rapidly, both on and off. When Q6 is switched on, it is desirable to drive the base hard in order to cause it to switch rapidly. Drive current is supplied from the positive line 20 by R7 and R8. Once the Q6 collector switches low, it is desirable to reduce the base drive to a value just sufficient to keep the output low. This will minimize stored base charge and permit Q6 to be switched off quickly at the transition from data to third state.

The clamp diode Q7 controls the drive to Q6. As the collector of Q6 goes into saturation, Q7 is forward biased and steals drive current from R7. The voltage drop across R8 is stabilized at a fraction of Q6's $V_{BE}$ by the presence of R9. As a result, the saturated collector voltage of Q6 can be controlled so as to be low enough to drive the control transistors off without, however, incurring a substantial storage time penalty when subsequently switching Q6 off.

The drive for Q6 is controlled by Q8. When Q8 is off, Q6 comes on into controlled saturation as described above. When Q8 switches on, it steals the drive from Q6 which turns off. The drive turning on Q8 is limited in a way somewhat analogous to the way Q7 controls Q6. The ratio of R10 to R11 is selected to produce a fraction of the $V_{BE}$ of Q8 across R10, when Q8 is on. This causes the base-emitter of Q9 to be forward biased as the collector voltage of Q8 falls. This, in turn, pulls current from R12 which is the source of base drive current from positive line 20 to Q8.

The voltage drop across R10 is selected so that when the collector of Q8 falls to a voltage which insures that Q6 is turned off, Q9 will come on, limit the base drive, and prevent Q8 from saturating completely. This has the effect of minimizing the storage time of Q8 and it also reduces the range of base voltage swing applied to Q6. By reducing this swing, the time required for Q6 to come on after Q8 goes off is reduced.

In addition, Q9 helps establish the input voltage threshold level for the three-state control input. The ratio of R13 to R11 is selected so that when Q8 is on, but not overdriven, the voltage at the top of R13 is one $V_{BE}$ higher than the desired threshold voltage. When Q9 is forward biased, stealing excess drive current from R12, it automatically reduces that voltage to that value.

When the base of Q10 is above the threshold, it will be off and current from R12 will drive the base of Q8 through the resistors. The resistor values are selected so that the voltage at the top of R13 will be stabilized by Q9 at a voltage equal to the desired threshold plus one $V_{BE}$. As the voltage applied to the base of Q10 at the $\overline{HBE}$ input is reduced toward the threshold, Q10 becomes forward biased and starts to steal current from R12. As $\overline{HBE}$ is driven below the threshold, Q10 will carry away more than just the excess drive, and base drive to Q8 will be reduced. Ultimately as $\overline{HBE}$ crosses the lower (zero) logic level, the drive to Q8 will be so reduced that R11 will switch it off. Then Q6 will come on and the buffer will switch from the third state to the data state as previously described.

The transistors which operate in or near saturation also are provided with a base diffusion isolation overlay arranged to closely follow the normal base diffusion outline. There is a narrow intervening epitaxial region so that the NPN base and the overlay form the emitter and collector, respectively, of a lateral PNP whose base is the NPN collector. This carries away holes injected into the N epitaxial region by excess NPN base current in the saturated mode. This overlay helps speed the turn-off of Q4 and Q5 which normally have no other anti-saturation provisions, and provides some improvement in the turn-off time of Q3, Q6 and Q8.

The operation of the transistors Q4 and Q5 could if desired be further speeded up by providing them with saturation clamps in the form of an additional inverted collector. Such a collector, made as collector 30 in Q3, could be directly connected to the base of the respective transistor and used to reduce the excess drive.

It will be noted from the drawing that the collectors of both Q1 and Q6 have two separate contacts, provided to improve performance. These separate contacts allow the series resistance associated with contacting the actual collector through the buried layer and epitaxial layer resistance to be isolated in series with the pull-up resistor R3 and R6 respectively. In this way a voltage closer to the actual collector voltage of the transistors involved can be used to drive the respective loads.

Although a preferred embodiment of this invention has been described hereinabove in detail, it is desired to emphasize that this has been for the purpose of illustrating the invention, and should not be considered as necessarily limitative of the invention, it being understood that many modifications can be made by those skilled in the art while still practicing the invention claimed herein.

I claim:

1. In an electronic component producing a multi-bit digital output to be coupled to a multi-line bus through which digital signals from other devices must also flow, a multi-stage three-state output buffer for coupling said component to said bus wherein each buffer stage comprises:
   two output transistors having their collector-emitter current paths connected in series between high and low supply potentials;
   an output line connected to the common junction between said transistors;
   data signal phase-splitting means having an input receiving a corresponding data bit from said component and having first and second outputs producing direct and inverted data signals corresponding to the logic level of said data bit;
   means coupling said direct and inverted data signals to the bases of said output transistors respectively to activate one or the other in accordance with the logic level of the data bit developed by said component, thereby to produce a corresponding output bit on said output line;
   a common control line for all of said buffer stages and switchable to a predetermined control state providing a command signal for establishing a high-impedance buffer output; and
   first and second amplifying control transistors having input means coupled to said control line and having first and second output means respectively connected to said first and second outputs of said phase-splitting means to provide for overriding said data signals in controlling the bases of both of said output transistors;
   said cotnrol transistors normally being deactivated and effectively isolated from said output transistors when said command signal is off, so as to permit said output transistors to respond in complementary fashion to said direct and inverted data signals in correspondence to the logic level of said component data bit;

said control transistors being operable in response to said command signal to pull down the bases of both of said output transistors simultaneously so as to override whichever of said data signals is "on" and effect a fast transition to a high impedance buffer output state.

2. Apparatus as claimed in claim 1, wherein said data signal phase-splitting means comprises a data transistor the base of which is coupled to a data line;

the collector of said data transistor being coupled to the base of one of said output transistors;

the emitter of said data transistor being coupled to the base of the other of said output transistors.

3. Apparatus as claimed in claim 1, wherein one of said output transistors comprises a saturation-sensing element for developing a flow of current when that output transistor approaches saturation; and circuit means responsive to said flow of current for reducing the drive to said one output transistor to provide for faster operation when it is subsequently turned off.

4. Apparatus as claimed in claim 3, wherein said element is coupled to said phase-splitting means to steal therefrom a part of the current which normally would serve as the drive to said one output transistor.

5. Apparatus as claimed in claim 1, wherein one of said output transistors is formed with a saturation-sensing element for developing a flow of current when that output transistor approaches saturation; and circuit means responsive to said flow of current for reducing the drive to the other output transistor to insure that it is in off state while said one output transistor is on.

6. Apparatus as claimed in claim 5, wherein saids circuit means comprises a resistor connected between one output of said phase-splitting means and the base of said other output transistor;

said flow of current passing through said resistor and reducing the voltage of said base so as to assure that the other output transistor remains off.

7. Apparatus as claimed in claim 1, wherein said control transistors are provided with means to speed up their turn off.

8. Apparatus as claimed in claim 7, wherein said speed-up means comprises a base diffusion isolation overlay.

9. Apparatus as claimed in claim 8, wherein said speed-up means comprises saturation clamps for each of said control transistors in the form of an inverted-mode collector directly connected to the base of the respective transistor.

10. Apparatus as claimed in claim 1, including common control circuitry connected to said control line for producing signals for operating said control transistors;

said control circuitry including means for developing active drive signals for both on and off states of said control transistors, to reduce storage times of those transistors and thereby enhance switching speed.

11. Apparatus as claimed in claim 10, wherein said control circuitry comprises a drive signal transistor having its collector connected to said control line;

a resistor connected between that collector and the power supply line; and means to apply a control signal to the base of said drive signal transistor;

the current through said resistor driving said control transistors on when said drive signal transistor is turned off by said control signal;

said drive signal transistor serving when turned on to sink the current through said resistor.

12. In an electronic component producing a multi-bit digital output to be coupled to a multi-line bus through which digital signals from other devices must also flow, a multi-stage three-state output buffer for coupling said component to said bus wherein each buffer stage comprises:

first and second output transistors connected in series between high and low supply potentials;

an output line connected to the common junction of said output transistors;

data logic means having an input receiving a corresponding data bit from said component and having output means producing data signals corresponding to the logic level of said data bit;

means coupling said data signals to said output transistors to produce a corresponding output bit on said output line;

a common control line for all of said buffer stages and switchable to a predetermined control state providing a command signal for establishing a high-impedance buffer output; and first and second amplifying control transistors having input means coupled to said control line and having output means connected directly to control terminals of said output transistors respectively by passive conductive means;

said control transistors normally being deactivated and effectively isolated from said output transistors when said command signal is off, so as to permit said output transistors to respond to said data signals in correspondence to the logic level of said component data bit;

said control transistors being operable in response to said command signal to deactivate said output transistors by actively drawing charge from said control terminals so as to override said data signals and effect a fast transition to a high-impedance buffer output state.

13. In an electronic component producing a multi-bit digital output signal and having a multi-stage output circuit comprising:

first and second output transistors having their collector-emitter current paths connected in series between high and low supply potentials;

an output line connected to the common junction between said transistors;

data signal phase-splitting means having an input receiving a corresponding data bit and having first and second outputs producing direct and inverted data signals corresponding to the state of said data bit;

means coupling said direct and inverted data signals to the bases of said output transistors respectively to activate one or the other in accordance with the state of the data bit developed by said component, thereby to produce a corresponding output bit on said output line;

said first output transistor comprising a saturation-sensing element in the form of an additional p/n junction within the first output transistor for developing a flow of current when that output transistor approaches saturation; and circuit means responsive to said flow of current for reducing the drive to one of said output transistors.

14. Apparatus as claimed in claim 13, wherein said circuit means reduces the drive to said first output transistor to assure fast operation when it is subsequently turned off.

15. Apparatus as claimed in claim 13, wherein said circuit means reduces the drive to said second output transistor to insure that it is in off state when said first transistor is in on state.

16. Apparatus as claimed in claim 15, wherein said circuit means comprises a resistor connected between said data siganl phase-splitting means and the control electrode of said second output transistor;

said flow of current passing through said resistor and reducing the voltage of said control electrode so as to assure that the second output transistor remains off.

17. Apparatus as claimed in claim 13, wherein said element is coupled to said data signal phase-splitting means to steal therefrom a part of the current which normally would serve as the drive to said one output transistor.

18. In an electronic component producing a multi-bit digital output to be coupled to a multi-line bus through which digital signals from other devices must also flow, a multi-stage three-state output buffer for coupling said component to said bus wherein each buffer stage comprises:

two output transistors connected in series between high and low supply potentials;

an output line connected to the common junction between said transistors;

data logic means coupled to said output transistors to activate one or the other in accordance with the logic level of the data bit developed by said component, thereby to produce a corresponding output bit on said output line;

a common control line for all of said buffer stages and switchable to a predetermined binary "on" state providing a command signal for establishing a high-impedance buffer output;

control transistor menas having input means coupled to said control line and having output means coupled to said output transistors to turn said output transistors off;

common control circuitry coupled to said control line to switch it between said "on" and a corresponding "off" state;

said common control circuitry including means for developing active drive signals for both on and off states of said control line;

said common control circuitry comprising a drive signal transistor having its collector connected to said control line; and a resistor connected between that collector and a power supply line;

means to apply a control signal to the base of said drive signal transistor;

the current through said resistor driving said control transistors on when said drive signal transistor is turned off; and said drive signal transistor serving when turned on to sink the current through said resistor.

19. Apparatus as claimed in claim 18, including circuit means connected between the base of said drive signal transistor and the power supply line for applying substantial drive to that base to effect a rapid switching to on state;

said circuit means including additional means, effective after the drive signal transistor has switched on, to reduce the base drive so as to minimize stored charge.

20. Apparatus as claimed in claim 19, wherein said additional means comprises a transistor having its output connected to the collector of said drive signal transistor, whereby the collector draws current from said additional transistor to reduce the current driving said drive signal transistor.

21. Apparatus as claimed in claim 20, wherein said additional transistor is connected as a diode;

a voltage-dropping resistor connected between the base of said transistor/diode and the base of said drive signal transistor; and means connected with said voltage-dropping resistor to produce a voltage drop which is a fraction of the base-emitter voltage drop of said drive signal transistor when that transistor is on.

22. In an electronic component producing a multi-bit digital output to be coupled to a multi-line bus through which digital signals from other devices must also flow, a multi-stage three-state output buffer for coupling said component to said bus wherein each buffer stage comprises:

two output transistors connected in series between high and low supply potentials;

an output line connected to the common junction between said transistors;

data logic means coupled to said output transistors to activate one or the other in accordance with the logic level of the data bit developed by said component, thereby to produce a corresponding output bit on said output line;

a common control line for all of said buffer stages and switchable to a predetermined binary "on" state providing a command signal for establishing a high-impedance buffer output;

control transistors means having input means coupled to said control line and having output means coupled to said output transistors to turn said output transistors off;

common control circuitry coupled to said control line to switch it between said "on" state and a corresponding "off" state;

said common control circuitry including means for developing active drive signals for both on and off states of said control line;

said common control circuitry comprising a drive signal transistor for activating said control transistor means;

a drive control transistor operating said drive signal transistor;

circuit means connected between the base of said drive control transistor and the power supply line for furnishing drive to that base;

said circuit means comprising additional means, effective after said drive control transistor has been turned on, for reducing the base drive to that transistor so as to minimize stored charge.

23. Apparatus as claimed in claim 22, wherein said additional means comprises an additional transistor with its output connected to the collector of said drive control transistor.

24. Apparatus as claimed in claim 23, including a voltage dropping resistor connected between the base of said additional transistor and the base of said drive control transistor to produce a voltage drop which is a fraction of the base-emitter voltage drop of said drive control transistor.

25. Apparatus as claimed in claim 23, including a voltage dropping resistor connected between the collector and base of said additional transistor;
a threshold transistor having its emitter connected to said voltage-dropping resistor and having its base connected to an input terminal for said common control circuitry;
said voltage-dropping resistor serving, when said drive control transistor is on, to bias said emitter a predetermined amount away from the desired threshold voltage for said threshold transistor.

26. Apparatus as claimed in claim 25, wherein said emitter bias is set at one base-emitter voltage drop higher than the desired threshold voltage.

* * * * *